(12) United States Patent
Vaktnäs et al.

(10) Patent No.: US 7,088,176 B2
(45) Date of Patent: Aug. 8, 2006

(54) METHOD AND ARRANGEMENT RELATING TO MULTICARRIER POWER AMPLIFIERS

(75) Inventors: Christer Vaktnäs, Gothenburg (SE); Hannes Illipe, Fjaras (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 10/479,799

(22) PCT Filed: Jun. 7, 2002

(86) PCT No.: PCT/SE02/01111

§ 371 (c)(1),
(2), (4) Date: Apr. 6, 2004

(87) PCT Pub. No.: WO02/099964

PCT Pub. Date: Dec. 12, 2002

(65) Prior Publication Data

US 2004/0150471 A1    Aug. 5, 2004

(30) Foreign Application Priority Data

Jun. 7, 2001    (SE) .................................. 0102026

(51) Int. Cl.
*H03F 1/00*    (2006.01)
(52) U.S. Cl. .................. 330/151; 330/149; 330/124 R
(58) Field of Classification Search .................. 330/52, 330/149, 151, 124, 53, 124 R, 124 D
See application file for complete search history.

(56) References Cited

U.S. PATENT DOCUMENTS

| | | | |
|---|---|---|---|
| 5,576,659 A | 11/1996 | Kensington | |
| 5,770,971 A | 6/1998 | McNicol | |
| 5,877,653 A | 3/1999 | Kim et al. | |
| 5,986,500 A * | 11/1999 | Park et al. | 330/124 D |
| 5,999,048 A | 12/1999 | Zhou | |
| 6,166,601 A | 12/2000 | Shalom et al. | |
| 6,208,204 B1 * | 3/2001 | Suzuki et al. | 330/52 |
| 6,489,844 B1 * | 12/2002 | Yamashita et al. | 330/52 |
| 6,606,984 B1 | 8/2003 | Mugg | |
| 6,792,251 B1 * | 9/2004 | Johannisson et al. | 455/126 |
| 2003/0151457 A1 * | 8/2003 | Gurvich et al. | 330/75 |
| 2003/0164732 A1 * | 9/2003 | Bingham | 330/151 |
| 2004/0251961 A1 * | 12/2004 | Braithwaite | 330/52 |

FOREIGN PATENT DOCUMENTS

WO    WO 00/03479    1/2000

* cited by examiner

*Primary Examiner*—Linh V. Nguyen
(74) *Attorney, Agent, or Firm*—Nixon & Vanderhye, P.C.

(57) ABSTRACT

The present invention relates to a Multi Carrier Power Amplifier, MPCA, comprising a number of parallel Multi Carrier Power Amplifiers, each comprising an amplification loop and an error cancellation loop, said amplification loop comprising at least a first gain and phase control network and a first amplifier and a second amplifier. The MPCA comprises an external loop comprising a second Spread Spectrum Signal added to said each first loop.

9 Claims, 4 Drawing Sheets

Fig. 1

METHOD AND ARRANGEMENT RELATING TO MULTICARRIER POWER AMPLIFIERS

This application is the U.S. national phase of international application PCT/SE02/01111, filed Jun. 7, 2002, which designated the U.S., the entire contents of which are hereby incorporated by reference.

1. Technical Field of the Invention

Generally, the present invention relates to a method and arrangement for enhanced linearity of a Multi Carrier Power Amplifier (MCPA).

2. Related Art and Other Considerations

To provide flexible communications systems, it is important to mix different modulation schemes, alter the number of carriers, and change rapidly between carrier frequencies without having to mechanically retune filters, reconfigure lossy combining networks, or add additional power amplifier stages for each new transceiver. A linear MCPA is a solution that provides the flexibility needed by handling a large number of signals with the same or mixed modulation formats.

In a RF amplifier for several simultaneous signals; the amplifier must be linear to suppress undesired frequency components. A known technique for linearizing an amplifier is feedforward, according to which the amplifier is linearized by adding an error signal in anti-phase.

FIG. 1 is a block diagram illustrating a known MCPA with feedforward linearisation. The circuit 10 comprises gain and phase control networks 11 and 12, amplifiers 13, 14, delay elements 15, 16, controller 17 and spread spectrum generator(s) 18. Inputs to the first amplifier 13 or main amplifier are from the first gain and phase control network 11 and spread spectrum generator 18. The output from the amplifier 13, which generates the output power and intermodulation products, is delayed by means of a delay element 15. The second amplifier 14 or error amplifier has as input the output of the second gain and phase control network 12, which is connected to the output of the first amplifier 13 and the delay element 16. The gain and phase control network 12 is controlled through the controller 17, which based on the (feedforward) input signal, spread spectrum signal and the fed back feedforward output from the output of the amplifier controls the gain and phase control network.

To be able to control the cancellation of the undesired frequencies (i.e. inter-modulation products) in point (E), the spread spectrum signal is injected in Loop 1 and detected in Loop 3. The detected spread spectrum signal from Loop 3 is used to minimize the spread spectrum in (E).

The linearity for a feedforward amplifier depends on the linearity of the main amplifier and the quality of the cancellation in (E). The cancellation bandwidth depends on the frequency response quality taking into account the amplitude, phase and delay correspondence in both branches.

The amplitude and phase deviation over the frequency in the error branch, i.e. loop 2, compared to the main branch results in that optimal intermodulation (IM) suppression is only achieved within a limited frequency band around the centre frequency of the spread spectrum signal.

The inputs to the MCPA are signals $f_1$ and $f_2$, which are connected (A) to the gain and phase control networks 11 and a small amount is connected via the reference branch (B) to the Loop 1 cancellation point (C).

A small part of the output power from amplifier 13 is coupled to the Loop 1 cancellation point (C). The delay 16 (time delay) is arranged to produce a delay equal to the delay in the main branch. In (C) the input signal f1, f2 is added to the amplified signal, with the same amplitude but in anti-phase, i.e. f1 and f2 will be cancelled and only the IM products from the main amplifier 13 are left.

In Loop 2, the input signals in the error branch are connected to the gain and phase control network 12 and then to the error amplifier 14. The time delay 15 of Loop 2 provides a time delay, which is equal to the time delay of the error branch. Loop 2 is adjusted so that IM products from the main amplifier 13 are cancelled in point (E).

Loop 3 controls the amplitude and phase of Loop 2 in the error branch.

A Spread Spectrum Signal (SSS) is injected before the main amplifier 13, which is amplified together with the original signal. In (F) some of the total power, containing f1 and f2, IM products and SSS, is decoupled. By eliminating f1 and f2 and comparing the signal with the same SSS as injected in Loop 1, the-amplitude and phase can be controlled in Loop 2 of the error branch. Thus, both SSS and IM products are cancelled in (E)

A super-linear feedforward amplifier, for amplifying radio-frequency input signals produced in one or more frequency channels over an input band is known through U.S. Pat. No. 6,166,601, which includes a radio-frequency power amplifier, which amplifies the signals. A signal cancellation circuit loop generates an error signal responsive to distortion products in the amplified signals. A digital correction block digitally equalizes the input signals responsive to a transfer function of the amplifier, whereby the input signals are substantially cancelled out of the error signal over the entire input band. An error cancellation circuit loop subtracts the error signal from the amplified signals to generate a linearized output signal.

In U.S. Pat. No. 6,606,984, an amplifier is described, which includes an amplifying section for simultaneously amplifying a plurality of input signals having different frequency bands, a distortion extracting section for separating and extracting at every different frequency bands a distortion component from a plurality of signals having the different frequency bands outputted from the amplifying section, a distortion compensation section for adjusting independently at every different frequency band the phase and the amplitude of the distortion component separated and extracted at every different frequency band and a distortion eliminating section for cancelling and outputting a distortion component from a plurality of signals having the different frequency bands outputted from the amplifying section based on the distortion component adjusted at every different frequency bands. The above distortion compensation section adjusts independently at every different frequency band the phase and the amplitude of the distortion component separated and extracted at every different frequency bands in such a manner that the above-mentioned phase and amplitude agree with the phases and the amplitudes of the distortion components contained in a plurality of signals having the different frequency bands outputted from the amplifying section.

WO 0003479 relates to a multi-carrier power amplifying arrangement, which comprises a number of amplifying means each of which includes a main amplifier and linearizing means. Furthermore it comprises signal adding means for adding the adding output signals from the amplifying means in phase, error detecting means for detecting the average phase error of the amplified signals and for providing a compensating control signal. Said compensating control signal is provided to each amplifying means at least to compensate for the average phase error.

U.S. Pat. No. 5,770,971, relates to a control arrangement and method for controlling a gain and phase adjuster used for controlling the gain and phase of a compensation signal for compensating for the distortion produced by a power amplifier. The control arrangement makes use of a reference signal, of known frequency, which is amplified along with the desired carrier signals. The reference signal component of the amplified signal is then isolated and a comparison is made, either with the actual reference signal, e.g., by a QAM demodulator, or alternatively with the known frequency of the reference signal, e.g., by a FM discriminator, in order to determine the differences in gain and in phase of the reference signal component of the amplified signal in comparison with the reference signal. For example, a QAM demodulator is used for producing a first difference signal indicative of the phase switch difference, and a second difference signal indicative of the gain switch difference. These signals are then correlated with the signal envelope of the main signal in order to produce signals indicative of the sign and magnitude of the control signals used to adjust the gain and phase adjuster in a feed back loop.

A linear power amplifier and method for removing the intermodulation distortion with a predistortion system and a feed forward system is disclosed in U.S. Pat. No. 5,877,653. The linear power amplifier having a main power amplifier includes: a predistortion system for firstly suppressing the intermodulation signal generated upon amplification of an RF signal in the main power amplifier, by generating a harmonics corresponding to the input RF signal and a predistortion signal with coupling the RF signal to the harmonics; and a feed forward system for secondly suppressing the intermodulation signal by cancelling the input RF signal and the output of the main power amplifier, extracting an intermodulation signal distortion, error-amplifying the extracted intermodulation signal distortion, and coupling the amplified intermodulation signal with the output of the main power amplifier.

BRIEF SUMMARY

An MCPA comprises a number of parallel Multicarrier Power Amplifiers, each comprising an amplification loop and an error cancellation loop. The amplification loop comprises at least a first gain and phase control network and a first amplifier. The error cancellation loop comprises at least a second gain and phase control network and a second amplifier.

In addition, for enhanced linearity, the MCPA includes an additional external loop and also an adaptive optimisation of the amplitude and phase rate substantially over the desired frequency band.

For this reason the initially mentioned MCPA comprises an external loop comprising a second Spread Spectrum Signal added to said each first loop. The input signal to each parallel MCPA stage and a directional coupler at outputs of said parallel MCPAs is arranged to couple the output signal to a control arrangement to detect a total residual intermodulation signal and the second Spread Spectrum Signal. The gain and phase control networks are controlled by means of said control arrangement.

Preferably, all MCPAs include an additional vector modulator in form of a gain and phase control network.

In one embodiment, an equalizer arrangement is provided in said cancellation loop of each MCPA. Preferably, but not exclusively, the equalizer arrangement is provided between said gain and phase control network and said second amplifier. The equalizer can be controlled in different sub-bands by controlling a centre frequency and/or bandwidth of said spread spectrum signal in different sections of the frequency band and detecting the variations. The equalizer can be controlled by employing several different spread spectrum signals having different codings.

The invention also relates to a method of enhancing intermodulation suppression in a Multicarrier Power Amplifier, MCPA, comprising a number of parallel Multicarrier Power Amplifiers, each comprising an amplification loop and an error cancellation loop. The amplification loop comprises at least a first gain and phase control network and a first amplifier. The error cancellation loop comprises at least a second gain and phase control network and a second amplifier. The method comprises providing said MCPA with an external loop comprising a second Spread Spectrum Signal added to said each first loop.

BRIEF DESCRIPTION OF THE DRAWINGS

In the following, the invention will be further described in a non-limiting way with reference to the accompanying drawings in which.

DETAILED DESCRIPTION OF THE EMBODIMENTS

As described herein, the intermodulation suppression product for a number of parallel MCPAs is improved by providing an external loop. The optimal intermodulation (IM) from each parallel MCPA is expected to have different amplitude and phase. The total IM signal is thus smaller, i.e. a certain cancellation is achieved.

Figure 1:
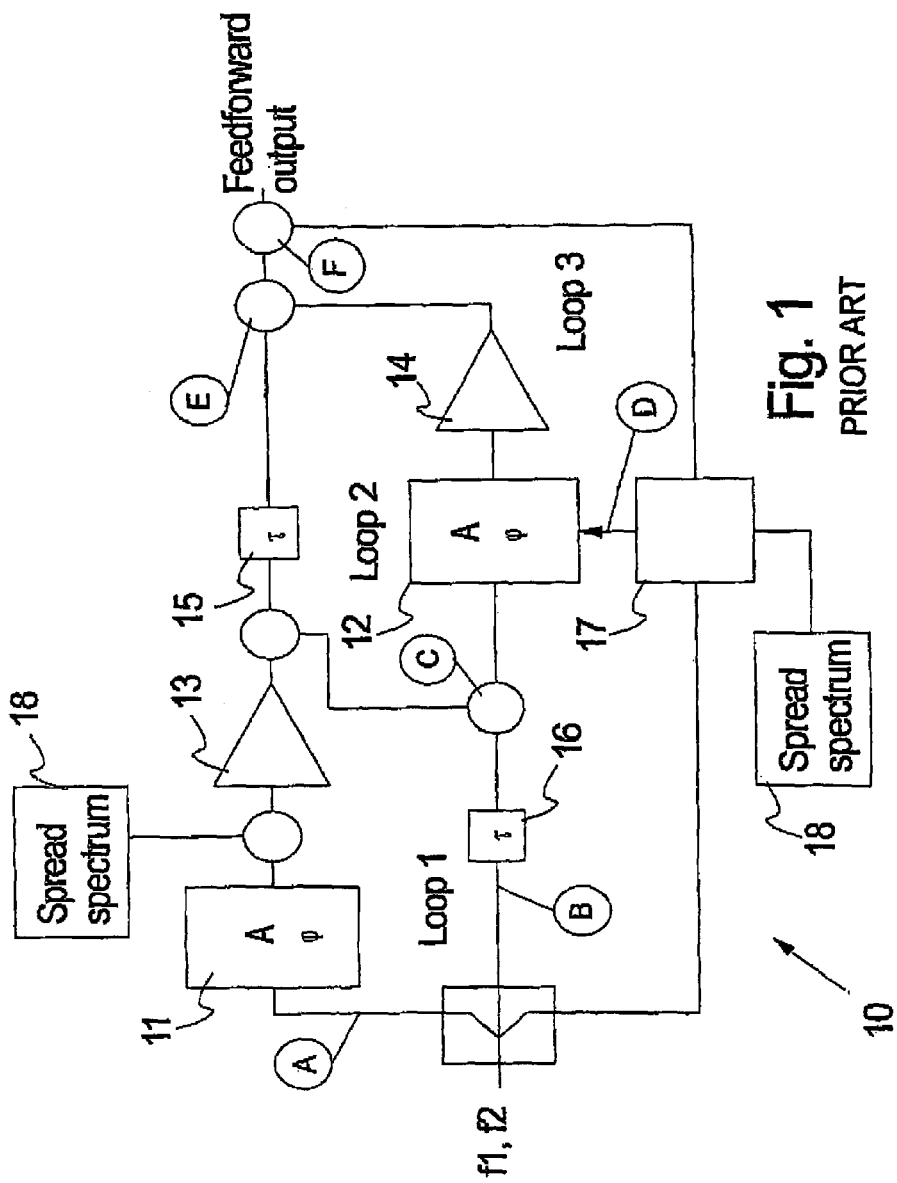
FIG. 1 is a block diagram illustrating an MCPA according to prior art.
Figure 2:
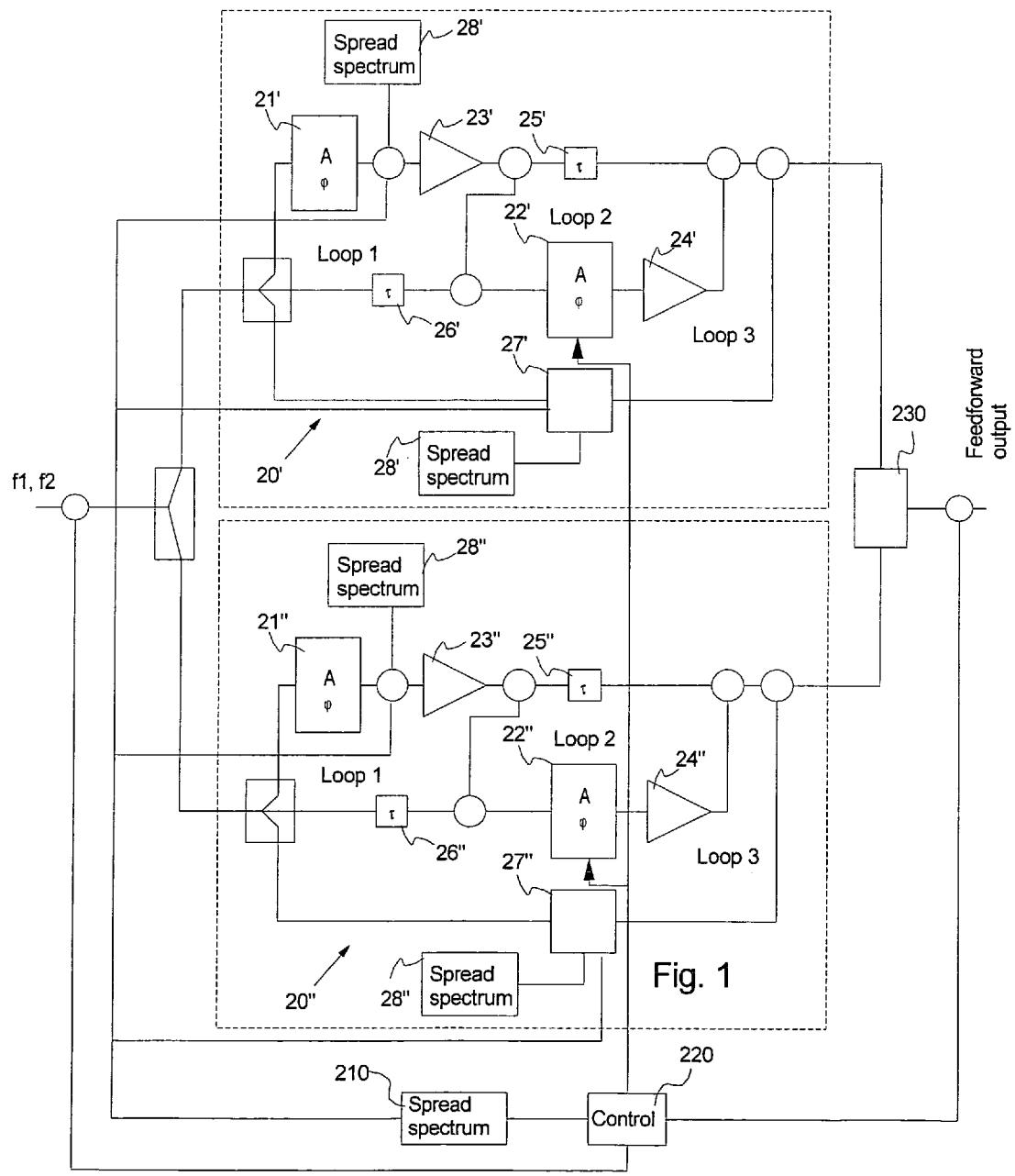
FIG. 2 illustrates a block diagram of a first example embodiment of a MCPA.

An example according to the first aspect of the technology is illustrated in FIG. 2. In the figure, the function of each MCPA 20' and 20" is the same as described above and parts having the same reference signs have the same function.

In FIG. 2, an additional Spread Spectrum Signal (SSS) 210 is added in all the first loops together with the first Spread Spectrum Signal 28. The Spread Spectrum Signal (SSS) 210 is also connected to the controllers 27', 27" in each Loop 2. Using a directional coupler 230 at all outputs of the MCPAs, the total residual IM signal can be detected. The gain and phase control network is controlled by means of a central controller 220. All MCPAs can be provided with gain and phase control network as additional vector modulators. In this way the total IM signal can be cancelled.

The MCPAs 20' and 20" comprise gain and phase control networks 21', 21" and 22', 22", amplifiers 23', 23", 24' and 24", delay elements 25', 25", 26' and 26", controller 27', 27" and spread spectrum generator 28' and 28". Inputs to the first amplifiers 23', 23" or main amplifiers are from the first gain and phase control networks 21', 21" and spread spectrum generator 28". The output from the amplifier 23', 23" is delayed by means of delay element 25', 25". The second amplifiers 24', 24" or error amplifiers have as input the output of the second gain and phase control network 22', 22", which is connected to the output of the first gain and phase control network 21', 21" and the delay element 26', 26". The gain and phase control networks 22', 22" are controlled through the controller 220, which uses the (feedforward) input signal, spread spectrum signal and fed back feedforward output from the output of the amplifier.

Figure 3:
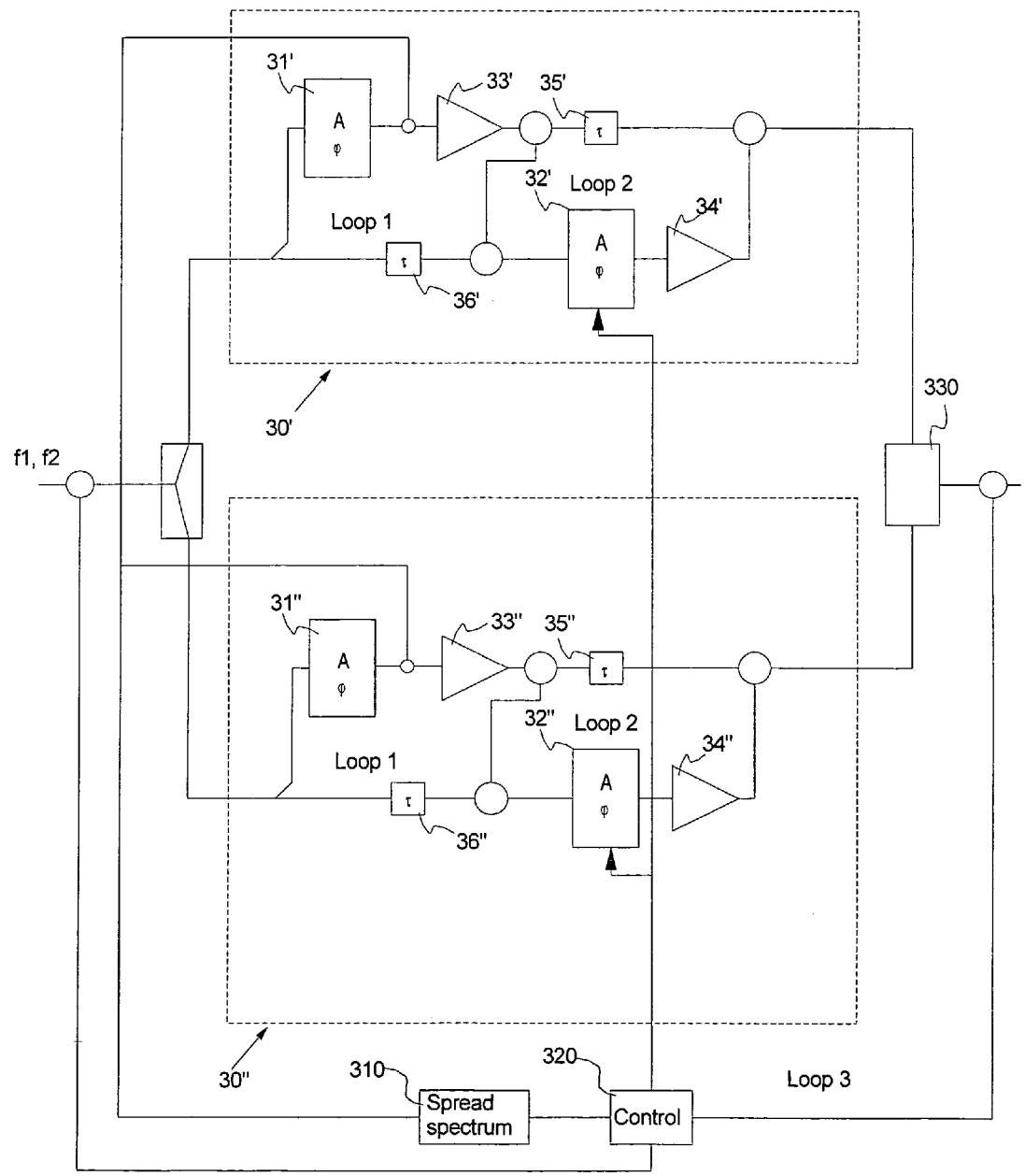
FIG. 3 illustrates a block diagram of a second example embodiment of a MCPA.

In a more preferred embodiment, as illustrated in FIG. 3, according the second aspect of the technology, the control and separate spread spectrum signals to each MCPA are substituted by one spread spectrum signal 310 and one controller 320.

Accordingly, the Spread Spectrum Signal 310 is added in all the first loops. Using a directional coupler 330 at all outputs of the MCPAs, the total residual IM signal can be detected. The gain and phase control network is controlled by means of the central control unit 320. In this way the total IM signal can be cancelled.

In this way, the Loop 3 of each MCPA is substituted by one central Loop 3. According to this embodiment the number of control circuits is reduced by N−1, wherein N is the number of MCPAs. This allows more simple MCPAs having the same performance at higher output power.

Figure 4:
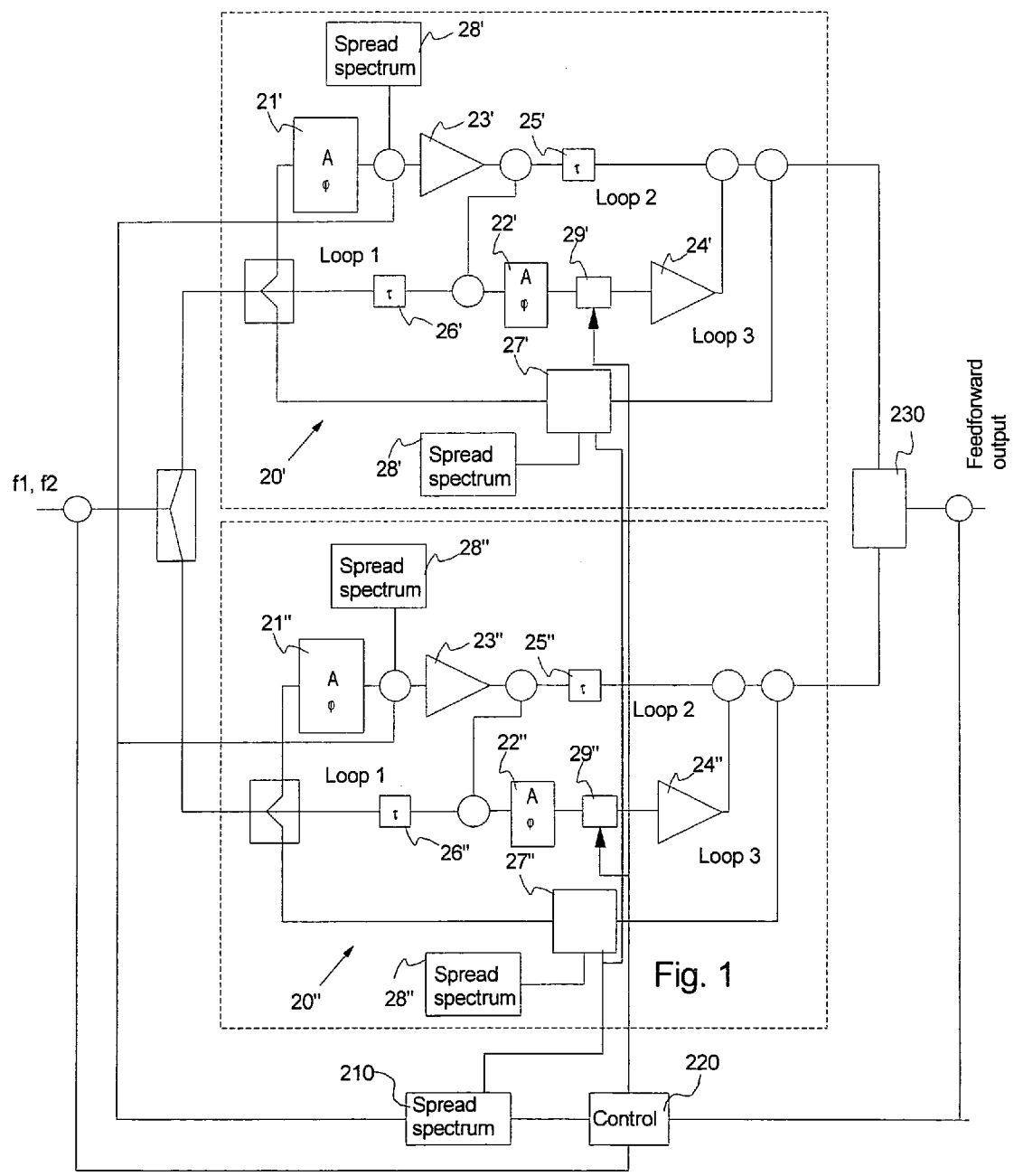
FIG. 4 illustrates a block diagram of a third example embodiment of a MCPA.

In yet another embodiment, as illustrated in FIG. 4, which corresponds to the embodiment of FIG. 2, equalisers 29' and 29" or a circuits having similar functionality are introduced into Loop 2 of the MCPAs 20' and 20".

Through introduction of the equalizer in Loop 2, i.e. between the output of the gain and phase control network 22', 22" and the input of the error amplifier 24', 24", which adjust the amplification in different parts of the frequency band, the suppression in loop 2 can be optimised over the desired frequency band.

Thus, the amplitude and/or phase variations in all parts, i.e. the gain and phase control networks 22', 22", of the error branch, i.e. gain and phase control networks 22', 22" and the amplifier 24', 24", can be corrected. The differences over the frequency band are detected in Loop 3, with respect to which the equalizer 29', 29" is controlled to minimize the differences. Thus, variations over time period and depending on the temperature, operation power, and different operation cases can be compensated for, which allows improvement of the intermodulation suppression.

In one preferred embodiment, it is also possible to control the centre frequency and/or bandwidth of the spread spectrum signal in different sections of the frequency band and detect the variations in loop 3. Thereby, it is possible to control the equalizers in different band parts.

It is also possible to control the equalizer by employing several spread spectrum signals having different codings. In this case a separate detection in loop 3 is needed. Moreover, the equalizer can be arranged in any part of Loop 2.

It is also possible to introduce equalisers in loops 2 of the embodiment according to FIG. 3, achieving same benefits as in the embodiment of FIG. 4.

Additionally but not exclusively, the MCPA according to the present invention can be used in base station amplifiers, which provides enhanced efficiency, power, bandwidth and IM suppression.

The invention is not limited to the shown embodiments but can be varied in a number of ways without departing from the scope of the appended claims and the arrangement and the method can be implemented in various ways depending on application, functional units, needs and requirements etc.

The invention claimed is:

1. A Multicarrier Power Amplifier (MCPA) comprising:
plural parallel Multicarrier Power Amplifiers, each Multicarrier Power Amplifier comprising an amplification loop and an error cancellation loop, said amplification loop comprising at least a first gain and phase control network and a first amplifier, said error cancellation loop comprising at least a second gain and phase control network and a second amplifier;
an external loop comprising an external loop Spread Spectrum Signal added to each first loop;
wherein the gain and phase control networks are controlled by a control arrangement, the control arrangement receiving as input signals a feedforward input signal, a fed back feed forward output signal, and the external loop Spread Spectrum Signal.

2. The MCPA according to claim 1, further comprising a directional coupler connected to outputs of the plural parallel MCPAs, and wherein an input signal to each parallel MCPA and the directional coupler are arranged to couple the output signal to the control arrangement for detecting a total residual intermodulation signal and the external loop Spread Spectrum Signal.

3. The MCPA according to claim 1, wherein the MCPAs comprise an additional vector modulator comprising a gain and phase control network.

4. The MCPA according to claim 1, further comprising an equalizer arrangement provided in the cancellation loop of each MCPA.

5. The MCPA according to claim 4, wherein the equalizer arrangement is provided between said second gain and phase control network and said second amplifier.

6. The MCPA according to claim 4, wherein the equalizer is controlled in different sub-bands by controlling a centre frequency and/or bandwidth of the exterior loop spread spectrum signal in different sections of the frequency band and detecting the variations.

7. The MCPA according to claim 6, wherein said equalizer is controlled by employing different spread spectrum signals having different codings.

8. A Multicarrier Power Amplifier (MCPA) comprising:
plural parallel Multicarrier Power Amplifiers, each Multicarrier Power Amplifier comprising an amplification loop and an error cancellation loop, said amplification loop comprising at least a first gain and phase control network and a first amplifier, said error cancellation loop comprising at least a second gain and phase control network and a second amplifier;
a directional coupler connected to receive and use outputs from each of the plural Multicarrier Power Amplifiers for generating a feedforward output signal;
an external loop wherein an external loop Spread Spectrum Signal is added to each first loop;
a control arrangement included in the external loop for controlling the gain and phase control networks of the plural Multicarrier Power Amplifiers, the control arrangement receiving as input signals a feedforward input signal, the feed forward output signal generated by the directional coupler, and the external loop Spread Spectrum Signal.

9. A method of enhancing intermodulation suppression in a Multicarrier Power Amplifier (MCPA), the MCPA comprising plural parallel Multicarrier Power Amplifiers, each Multicarrier Power Amplifier comprising an amplification loop and an error cancellation loop, said amplification loop comprising at least a first gain and phase control network and a first amplifier, said error cancellation loop comprising at least a second gain and phase control network and a second amplifier; the method comprising:
providing said MCPA with an external loop comprising an external Spread Spectrum Signal added to each first loop and with a control arrangement controlling the gain and phase control networks; and
applying a feed forward input signal, a fed back feed forward output signal, and a second Spread Spectrum Signal to the control arrangement as input signals.

* * * * *